United States Patent
Im

(10) Patent No.: US 7,843,722 B2
(45) Date of Patent: Nov. 30, 2010

(54) NONVOLATILE SEMICONDUCTOR MEMORY DEVICE AND PROGRAMMING METHOD THEREOF

(75) Inventor: Jae-Woo Im, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 668 days.

(21) Appl. No.: 11/765,057

(22) Filed: Jun. 19, 2007

(65) Prior Publication Data

US 2008/0175047 A1 Jul. 24, 2008

(30) Foreign Application Priority Data

Jan. 18, 2007 (KR) ...................... 10-2007-0005648

(51) Int. Cl.
*G11C 16/04* (2006.01)
(52) U.S. Cl. ............................. 365/185.03; 365/185.18; 365/185.24
(58) Field of Classification Search ............ 365/185.03, 365/185.17, 185.18, 185.19, 185.24
See application file for complete search history.

(56) References Cited

U.S. PATENT DOCUMENTS

| | | | |
|---|---|---|---|
| 5,764,568 A * | 6/1998 | Chevallier .............. | 365/185.03 |
| 6,172,912 B1 * | 1/2001 | Hirano et al. .......... | 365/185.28 |
| 2005/0190603 A1 * | 9/2005 | Lee et al. ................ | 365/185.22 |
| 2006/0193169 A1 * | 8/2006 | Nazarian ................ | 365/185.03 |
| 2007/0247907 A1 * | 10/2007 | Chang et al. ........... | 365/185.16 |
| 2007/0279982 A1 * | 12/2007 | Shibata et al. ......... | 365/185.03 |

FOREIGN PATENT DOCUMENTS

| | | |
|---|---|---|
| JP | 10-011983 | 1/1998 |
| JP | 11-317087 | 11/1999 |
| JP | 2000-021185 | 1/2000 |
| KR | 1020050087264 | 8/2005 |

* cited by examiner

*Primary Examiner*—VanThu Nguyen
*Assistant Examiner*—Douglas King
(74) *Attorney, Agent, or Firm*—F. Chau & Associates, LLC

(57) ABSTRACT

A nonvolatile semiconductor memory device and a programming method thereof are provided. The programming method includes first programming a cell among a plurality of adjacent memory cells to the highest threshold voltage distribution corresponding to a data state, and subsequently programming the other adjacent cells to the lower threshold voltage distributions corresponding to second and third data states. The second data state and the third data state may have the second highest threshold voltage distribution and the third highest threshold voltage distribution, respectively, or the third highest threshold voltage distribution and the second highest threshold voltage distribution, respectively.

14 Claims, 8 Drawing Sheets

NONVOLATILE SEMICONDUCTOR MEMORY DEVICE AND PROGRAMMING METHOD THEREOF

CROSS-REFERENCE TO RELATED PATENT APPLICATION

This application claims the priority of Korean Patent Application No. 10-2007-005648, filed on Jan. 18, 2007, in the Korean Intellectual Property Office, which is incorporated by reference herein in its entirety.

FIELD OF THE INVENTION

The present invention relates to semiconductor memory devices, and more particularly, to a nonvolatile flash memory device for enabling efficient programming and a method thereof.

BACKGROUND OF THE INVENTION

FIG. 1 illustrates a cross-section of a flash memory cell in a nonvolatile semiconductor memory device. Referring to FIG. 1, the flash memory cell includes a source 3 and a drain 4, which are formed on a P-type semiconductor substrate 2 using N+ impurities such that a channel region is disposed between the source 3 and the drain 4, a floating gate 6, which is disposed above the channel region such that a first insulating layer 7 (e.g., a thin tunnel oxide layer) having a thickness of 100 Å or less is disposed between the channel region and the floating gate 6; and a control gate 8, which is insulated from the floating gate 6 by a second insulating layer 7 (e.g., an ONO layer) disposed between the control gate 8 and the floating gate 6. The source 3, the drain 4, the control gate 8, and the semiconductor substrate 2 are connected with power supply terminals Vs, Vd, Vg, and Vb, respectively, in order to apply voltages necessary for programming (write), erase, and read operations of a semiconductor memory device (see FIG. 2).

In the programming (write) operation of the conventional flash memory, hot electron injection occurs from the channel region adjacent to the drain 4 into the floating gate 6, thereby programming the flash memory cell. The electron injection is carried out by grounding the source 3 and the semiconductor substrate 2, applying a high voltage of 10 V to a control gate electrode Vg, and applying a voltage of 5V to 6 V, which is appropriate for generating hot electrons, to the drain 4. When the flash memory cell is programmed through the voltage application, significant negative charges are accumulated at the floating gate 6 so as to serve to increase a threshold voltage of the programmed flash memory cell detectable during the next read operation.

However, in the conventional flash memory, when a cell adjacent to a programmed cell is programmed, the threshold voltage of the previously programmed (adjacent) cell changes due to the influence of charges accumulated at the currently programmed cell, i.e., due to capacitive floating gate coupling. In particular, when a flash memory cell can have multiple states, a margin between the states is narrow, and therefore, a programming method for reducing the floating gate coupling is needed.

FIG. 2 illustrates a cell structure in a nonvolatile NOR semiconductor memory. Referring to FIG. 2, the threshold voltage of a first cell T is influenced by prior programming of adjacent cells C1, C2, C3, C4, B1, B2, W1, and W2. The influence of the adjacent cells B1, B2, and W1 may be large while the influence of the adjacent cells C3, C4, and W2, which have a metal contact MC interposed between the cell T and each of the cells C3, C4, and W2, may be slight.

The threshold voltage of the cell T is affected when any of the adjacent cells C1, C2, C3, C4, B1, B2, W1, or W2 is programmed. The amount of change in the threshold voltage of the cell T is approximately proportional to the amount of charges accumulated in each of the adjacent cells C1, C2, C3, C4, B1, B2, W1, or W2 in a programmed state. For example, the threshold voltage of cell T is affected most when any of the adjacent cells C1, C2, C3, C4, B1, B2, W1, or W2 is programmed from an erased state to a highest state (e.g., a "00" state). In order to minimize this influence, each cell is programmed to a voltage lower than the target threshold voltage of each state under the influence of floating gate coupling until the cell is programmed to a final target threshold voltage, thereby reducing the influence of the floating gate coupling.

FIG. 3 illustrates threshold voltage distributions to explain a conventional programming method of a conventional nonvolatile semiconductor memory device. FIG. 3 shows target threshold voltage distributions (i.e., ranges defined by solid lines) in a memory cell having four states (e.g., a "00" state, a "01" state, a "10," state, and a "11" state).

According to the conventional programming method, in step S1 cells to be programmed are programmed to a voltage a predetermined level lower than a target voltage of a third state (e.g., the "10" state). Thereafter, in step S2, among the programmed cells, cells to be programmed to a second state (e.g., the "01" state) are programmed to a voltage a predetermined level lower than a target voltage of the second state. In step S3, among the cells programmed in step S2, cells to be programmed to a first state (e.g., the "00" state) are programmed to a voltage a predetermined level lower than a target voltage of the first state.

Thereafter, in step S4, cells to be programmed to the third state (e.g., the "10" state) are programmed from the state programmed in step S1 to the target threshold voltage of the third state. In step S5, the cells to be programmed to the second state (e.g. the "01" state) are programmed from the state programmed in step S2 to the target threshold voltage of the second state. In step S6, the cells to be programmed to the first state (e.g., the "00" state) are programmed from the state programmed in step S3 to the target threshold voltage of the first state.

As described above, a cell is programmed to a voltage lower than the target threshold voltage of each state under the influence of floating gate coupling so that the distribution of the threshold voltage changing due to the floating gate coupling corresponds with the distribution of the target threshold voltage, thereby mitigating the influence of the floating gate coupling as a whole. However, as illustrated in FIG. 3, the number of programming operations increases, which increases entire programming time, and thus reduces the effective speed of the memory device.

Therefore, a programming method and memory device for reducing the number of programming operations and for reducing the floating gate coupling effect are desired.

SUMMARY OF THE INVENTION

Various embodiments of the present invention provide a nonvolatile semiconductor memory device requiring fewer programming operations to be performed to program a nonvolatile semiconductor memory cell having multiple (e.g., first, second, third and fourth) states and that effectively reduces the influence of floating gate coupling, and a corresponding method of operating a nonvolatile semiconductor memory device.

According to some embodiments of the present invention, there is provided a programming method of a nonvolatile semiconductor memory device which includes a plurality of adjacent memory cells each having threshold voltage distributions respectively corresponding to multiple (e.g., first, second, third and fourth) data states. The programming method includes programming a cell to be programmed to the first data state among the plurality of adjacent memory cells to a threshold voltage distribution corresponding to the first data state, and programming a cell to be programmed to the second data state and a cell to be programmed to the third data state among the plurality of adjacent memory cells. The first data state may have the highest threshold voltage distribution among the multiple data states.

The programming of the cell to be programmed to the second data state and the cell to be programmed to the third data state may include programming the cell to be programmed (directly) to the second data state to the threshold voltage distribution corresponding to the second data state, and programming the cell to be programmed to the third data state (directly) to the threshold voltage distribution corresponding to the third data state.

The programming of the cell to be programmed to the second data state and the cell to be programmed to the third data state may include programming the cell to be programmed to the second data state to a voltage distribution a predetermined level lower than the threshold voltage distribution corresponding to the second data state; programming the cell to be programmed to the third data state to a threshold voltage distribution corresponding to the third data state, and programming the cell, which has been programmed to the voltage distribution the predetermined level lower than the threshold voltage distribution corresponding to the second data state, to the threshold voltage distribution corresponding to the second data state.

The second data state and the third data state may be the second highest threshold voltage distribution and the third highest threshold voltage distribution, respectively, among the multiple data states.

Alternatively, the second data state and the third data state may be the third highest threshold voltage distribution and the second highest threshold voltage distribution, respectively, among the multiple data states.

The programming of the cell to be programmed to the second data state to the voltage distribution the predetermined level lower than the threshold voltage distribution corresponding to the second data state may include programming the cell such that a threshold voltage of the cell is increased by a predetermined value until the threshold voltage of the cell reaches the voltage distribution the predetermined level lower than the threshold voltage distribution corresponding to the second data state; verifying (determining) whether the increased threshold voltage meets the voltage distribution the predetermined level lower than the threshold voltage distribution corresponding to the second data state; and if it is verified (determined) that the increased threshold voltage does not meet the voltage distribution the predetermined level lower than the threshold voltage distribution corresponding to the second data state, then programming the cell to increase the threshold voltage of the cell by the predetermined value again.

Alternatively the programming of the cell to be programmed to the second data state to the voltage distribution the predetermined level lower than the threshold voltage distribution corresponding to the second data state may include performing a programming operation, in which a threshold voltage of the cell is increased by a predetermined value a predetermined number of times until the cell is programmed to the voltage distribution the predetermined level lower than the threshold voltage distribution corresponding to the second data state.

The programming of the cell to be programmed to the second data state and the cell to be programmed to the third data state may include programming the cell to be programmed to the second data state and the cell to be programmed to the third data state to a voltage distribution a predetermined level lower than the threshold voltage distribution corresponding to the third data state, programming the cell to be programmed to the second data state to the threshold voltage distribution corresponding to the second data state, and programming the cell to be programmed to the third data state to the threshold voltage distribution corresponding to the third data state. The first, second and third data states may have the highest, second highest and third highest threshold voltage distributions, respectively.

The programming of the cell to be programmed to the second data state and the cell to be programmed to the third data state to the voltage distribution the predetermined level lower than the threshold voltage distribution corresponding to the third data state may include programming the cells such that a threshold voltage of each cell is increased by a predetermined value until the threshold voltage of the cell reaches the voltage distribution the predetermined level lower than the threshold voltage distribution corresponding to the third data state; verifying whether the increased threshold voltage meets the voltage distribution the predetermined level lower than the threshold voltage distribution corresponding to the third data state; and if it is verified that the increased threshold voltage does not meet the voltage distribution the predetermined level lower than the threshold voltage distribution corresponding to the third data state, then programming the cell to increase the threshold voltage of the cell by the predetermined value again.

Alternatively the programming of the cell to be programmed to the second data state and the cell to be programmed to the third data state to the voltage distribution the predetermined level lower than the threshold voltage distribution corresponding to the third data state may include performing a programming operation, in which a threshold voltage of each cell is increased by a predetermined value a predetermined number of times until the cell is programmed to the voltage distribution the predetermined level lower than the threshold voltage distribution corresponding to the third data state.

According to other embodiments of the present invention, there is provided a nonvolatile semiconductor memory device including a memory cell array comprising a plurality of adjacent memory cells having threshold voltage distributions respectively corresponding to multiple (e.g. first, second, third, and fourth) data states, a column selector configured to select a bit line included in the memory cell array; an input/output buffer configured to temporarily store data to be programmed into the memory cell array or data output from the memory cell array; a write driver configured to program the data stored in the input/output buffer into a memory cell selected by the column selector from among the memory cells comprised in the memory cell array; and a controller configured to control the write driver to first program a cell to be programmed to a first data state, among the plurality of adjacent memory cells to be programmed to the multiple data states, to the threshold voltage distribution corresponding to the first data state based on the data stored in the input/output buffer.

The controller may next control the write driver to program a cell to be programmed to a second data state to a threshold voltage distribution corresponding to the second data state after the cell to be programmed to the first data state is programmed and to program a cell to be programmed to a third data state to the threshold voltage distribution corresponding to the third data state after the cell to be programmed to the second data state is programmed.

After the cell to be programmed to the first data state is programmed, the controller may control the write driver to program a cell to be programmed to a second data state to a voltage distribution a predetermined level lower than the threshold voltage distribution corresponding to the second data state, to program a cell to be programmed to a third data state to the threshold voltage distribution corresponding to the third data state; and to program the cell that has been programmed to the voltage distribution the predetermined level lower than the threshold voltage distribution corresponding to the second data state, to the threshold voltage distribution corresponding to the second data state.

In order to program the cell to be programmed to the second data state to the voltage distribution the predetermined level lower than the threshold voltage distribution corresponding to the second data state, the controller may control the write driver to program the cell such that a threshold voltage of the cell is increased by a predetermined value until the threshold voltage of the cell reaches the voltage distribution the predetermined level lower than the threshold voltage distribution corresponding to the second data state; to verify whether the increased threshold voltage meets the voltage distribution the predetermined level lower than the threshold voltage distribution corresponding to the second data state; and if it is verified that the increased threshold voltage does not meet the voltage distribution the predetermined level lower than the threshold voltage distribution corresponding to the second data state, then to program the cell so as to increase the threshold voltage of the cell by the predetermined value again.

In order to program the cell to be programmed to the second data state to the voltage distribution the predetermined level lower than the threshold voltage distribution corresponding to the second data state, the controller may control the write driver to perform a programming operation, in which a threshold voltage of the cell is increased by a predetermined value, a predetermined number of times until the cell is programmed to the voltage distribution the predetermined level lower than the threshold voltage distribution corresponding to the second data state.

The controller may control the write driver to program a cell to be programmed to a second data state and a cell to be programmed to a third data state to a voltage distribution a predetermined level lower than the threshold voltage distribution corresponding to the third data state, to program the cell to be programmed to the second data state to the threshold voltage distribution corresponding to the second data state, and to program the cell to be programmed to the third data state to the threshold voltage distribution corresponding to the third data state.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising." or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present applications and will not be interpreted in an idealized or overly formal sense unless expressly so defined herein.

BRIEF DESCRIPTION OF THE DRAWINGS

The above and other features of the present invention will become more apparent to persons skilled in the art by describing in detail exemplary embodiments thereof with reference to the attached drawings in which.

DETAILED DESCRIPTION OF EXEMPLARY EMBODIMENTS OF THE INVENTION

Figure 1:
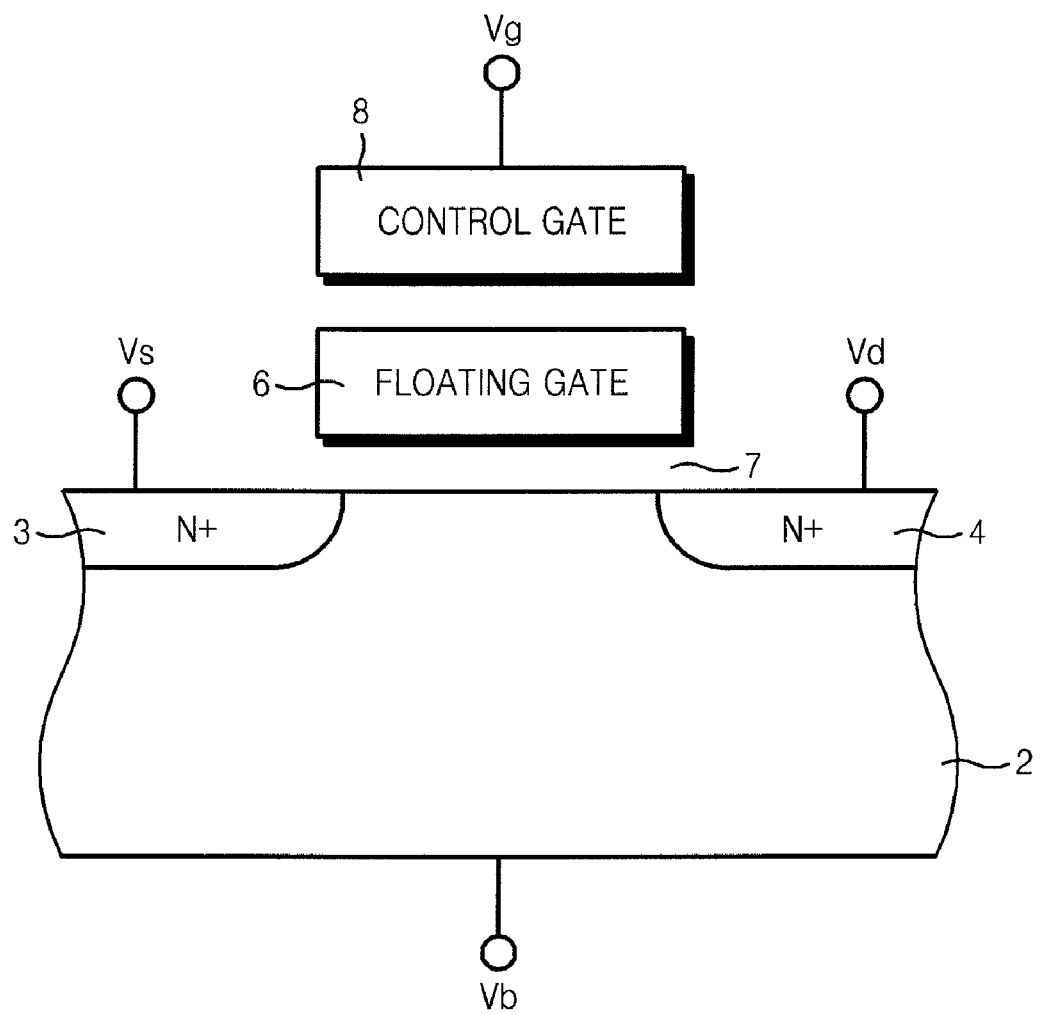
FIG. 1 illustrates a cross-section of a flash memory cell in a nonvolatile memory device.
Figure 2:
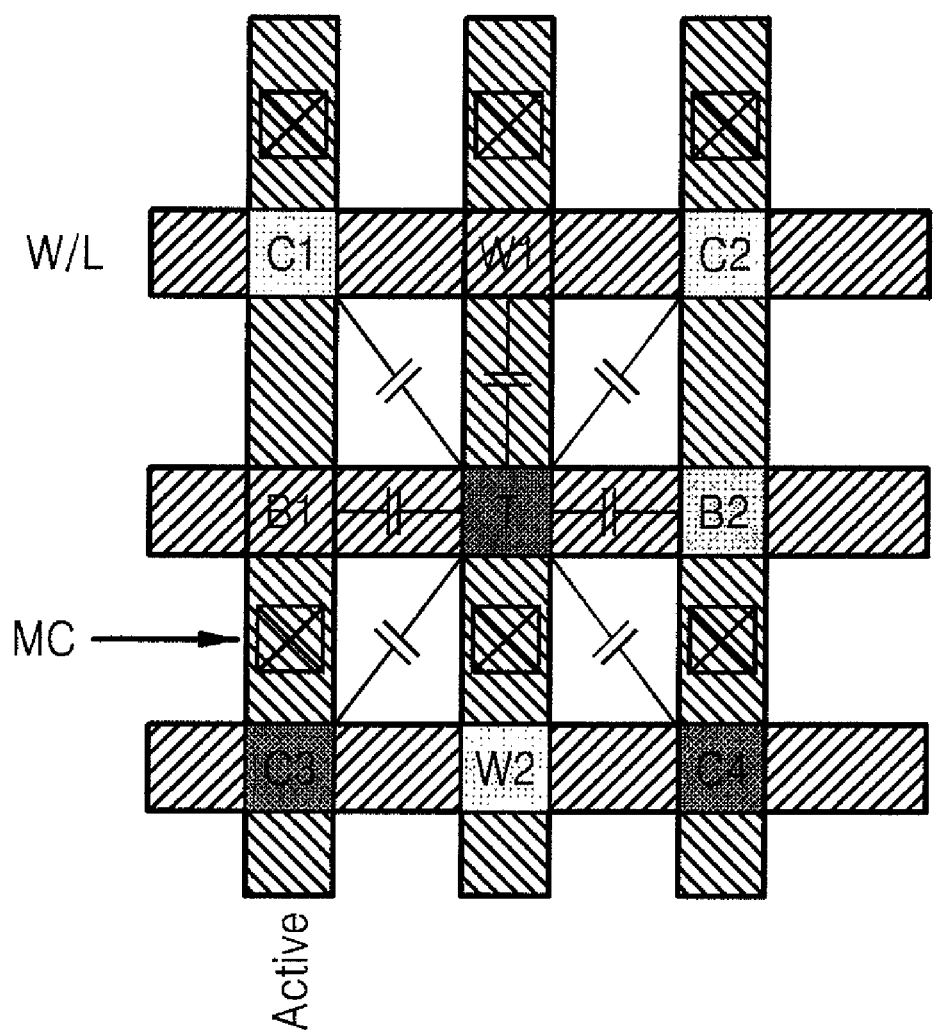
FIG. 2 illustrates a cell structure in nonvolatile NOR flash memory.
Figure 3:
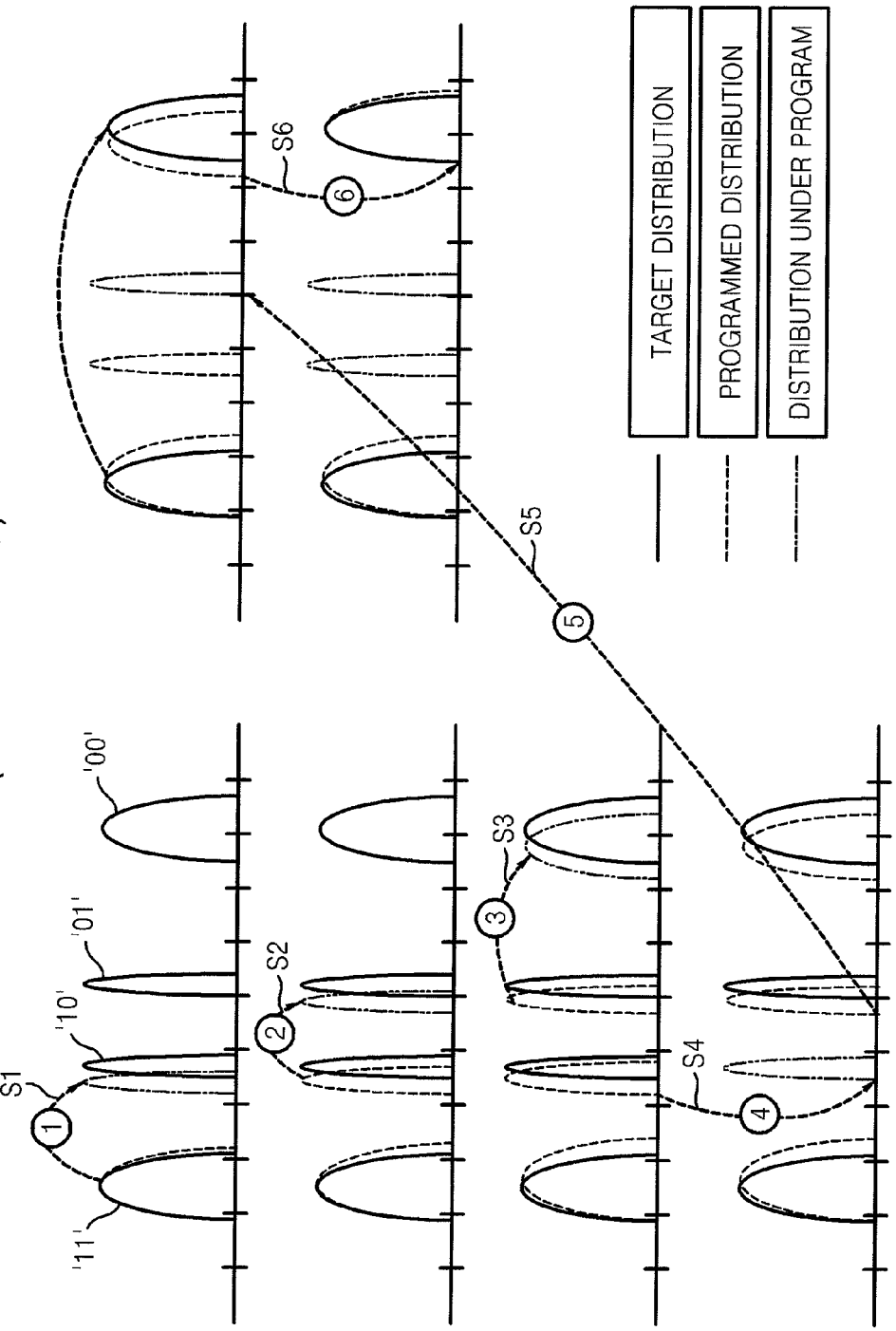
FIG. 3 illustrates threshold voltage distributions to explain a programming method of the conventional nonvolatile semiconductor memory device of FIG. 2.
Figure 4:
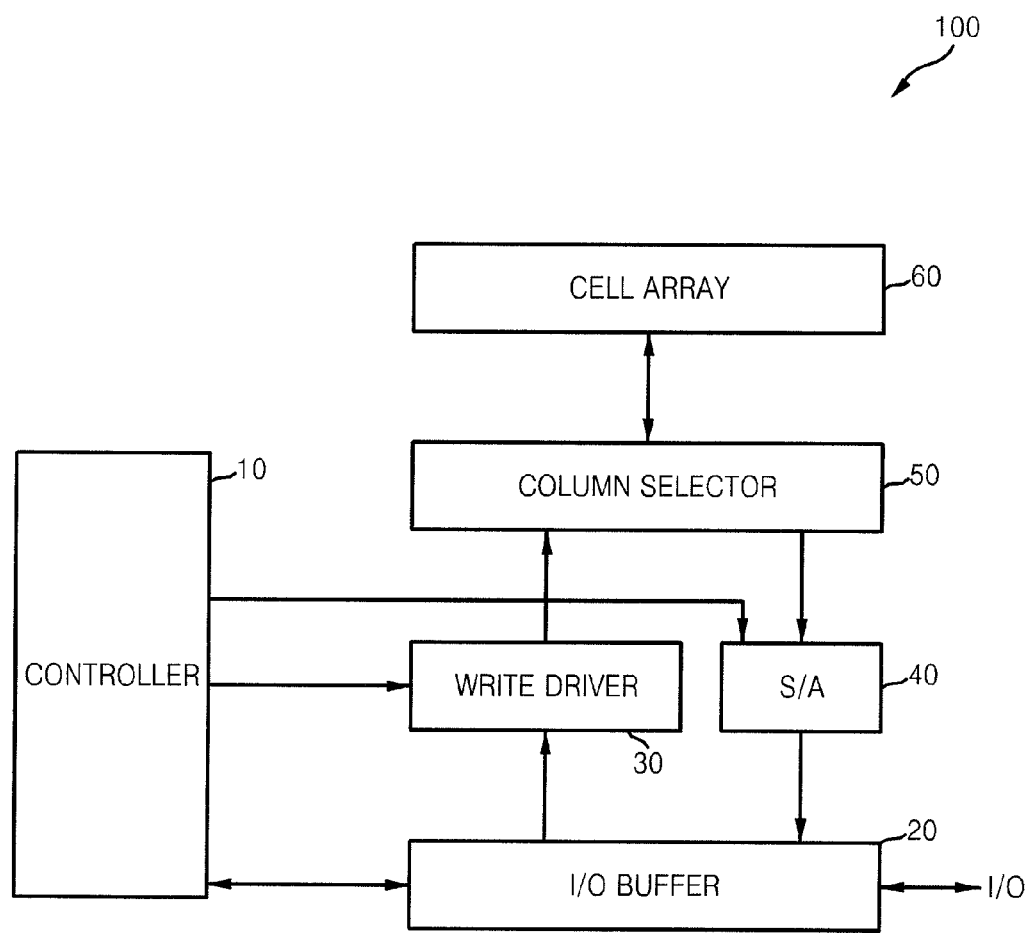
FIG. 4 is a functional block diagram of a nonvolatile semiconductor memory device according to an embodiment of the present invention.

FIG. 4 is a functional block diagram of a nonvolatile semiconductor memory device 100 according to an embodiment of the present invention. The nonvolatile semiconductor memory device 100 includes a controller 10, an input/output (I/O) buffer 20, a write (programming) driver 30, a column selector 50, and a memory cell array 60. The nonvolatile semiconductor memory device 100 may further include a sense amplifier (S/A) 40 for detecting stored charges in the memory cell array 60. It is assumed that the nonvolatile semiconductor memory device 100 is a NOR flash memory device, but the scope of the present invention is not restricted thereto.

Each memory cell included in the memory cell array 60 can store multiple data states and has one threshold voltage corresponding to each of its multiple data states. For instance, a memory cell included in the memory cell array 60 may have four states, i.e. a "11" state corresponding to an erased cell, a "00" state corresponding to a highest state, a "01" state corresponding to a second highest state, and a "10" state corresponding to a third highest state, thus storing 2-bits of information. The four states and the corresponding 2 bits of information storage are just an example, and the scope of the present invention is not restricted thereto.

The highest state, i.e. the "00" state has the highest threshold voltage distribution among the data states. The second highest state i.e., the "01" state has the second highest threshold voltage distribution among the data states. The third highest state, i.e., the "10", state has the third highest threshold voltage distribution among the data states.

When programming data into the memory cell array 60, the controller 10 controls the write (programming) driver 30 to program (write) the data, which is received from outside and stored in the I/O buffer 20, into the memory cell array 60. In order to select a memory cell to be programmed with the received data, the nonvolatile semiconductor memory device 100 may further include a row decoder (not shown) and may perform the programming operation on a memory cell selected by the row decoder and the column selector 50. In addition, the nonvolatile semiconductor memory device 100 may also include a high-voltage generation circuit (not shown) to generate the relatively high voltages necessary for the programming operations, the erase operation, and the read operation. The high-voltage generation circuit is well known to those skilled in the art, and thus, a detailed description thereof will be omitted.

The sense amplifier (S/A) 40 may sense and amplify data stored in a memory cell selected by the column selector 50 and output the amplified data to the I/O buffer 20.

Figure 5:
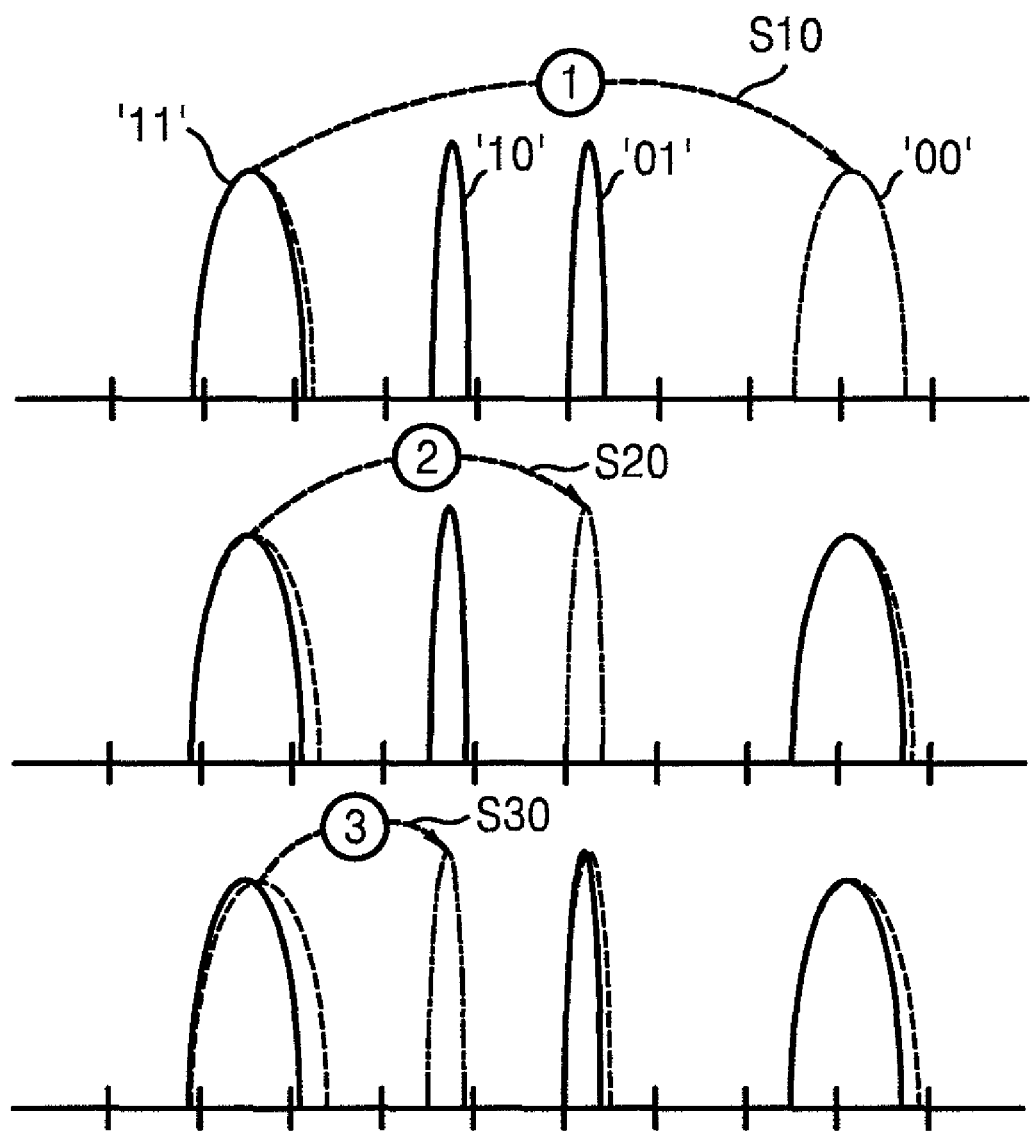
FIG. 5 illustrates threshold voltage distributions to explain a first exemplary programming method of the nonvolatile semiconductor memory device, according to an embodiment of the present invention of FIG. 5.

FIG. 5 illustrates threshold voltage distributions to explain a first exemplary programming method of the nonvolatile semiconductor memory device 100 of FIG. 4, according to an embodiment of the present invention. Referring to FIGS. 4 and 5, in step S1, the nonvolatile semiconductor memory device 100 programs a cell (having multiple data states) to be programmed in a first data state (e.g., the highest state or the "00" state) to a threshold voltage distribution corresponding to the first data state, based on data stored in the I/O buffer 20. For this programming operation, the controller 10 may control the write driver 30. Here, it is apparent that the controller 10 may control other elements, e.g., the I/O buffer 20 and the column selector 50, during a programming operation.

In other words, the nonvolatile semiconductor memory device 100 may program first a cell to be programmed to the highest state (or the "00" state) in step S10. As described above, the highest state, i.e., the "00" state has a highest threshold voltage distribution among the data states. When a cell to be programmed to the highest state "00" is programmed first, only an erase cell (corresponding to the "11" state) is influenced by floating gate coupling. It is seen in FIG. 5 that the erased cell slightly changes its threshold voltage (which is illustrated by a dotted line at a threshold voltage distribution corresponding to "11") due to the floating gate coupling. However, the margin between the threshold voltage distribution of the erased cell and the threshold voltage distribution of a cell corresponding to a next upper state, i.e., the "10" state, (i.e., a distance between the distribution corresponding to the "11" state and a distribution corresponding to the "10" state) is wide, and therefore, the erased cell is not much influenced by the floating gate coupling.

In step S20, the nonvolatile semiconductor memory device 100 may program a cell to be programmed to the second highest state "01" to the threshold voltage distribution corresponding to the second highest state "01". The second highest state "01" indicates a state having a second highest threshold voltage distribution among the multiple data states. The influence of floating gate coupling occurring during the current programming operation is illustrated in FIG. 5. In detail, the threshold voltage distribution of the cell programmed to the highest state "00" increases slightly and the threshold voltage distribution of the erased cell also increases a little more than in step S10. Even if the threshold voltage distribution at the highest state "00" increases a little, there is no other state having a higher threshold voltage distribution, and therefore, the influence of the floating gate coupling may be ignored. In addition, since the threshold voltage distribution of the erase cell has a wide margin with that of the next upper state, i.e., the "10" state, the erased cell is less influenced by the floating gate coupling than other cells.

In step S30, the nonvolatile semiconductor memory device 100 may program a cell to be programmed to the third highest state "10" to the threshold voltage distribution corresponding to the third highest state "10". As described above, the third highest state "10" indicates a state having a third highest threshold voltage distribution among the multiple data states. The influence of floating gate coupling occurring during the current programming operation is also illustrated in FIG. 5. In detail, the threshold voltage distribution of the cell programmed to the highest state "00" increases a little more than in step S20 and the threshold voltage distribution of the erased cell also increases a little more than in step S20. Also, the threshold voltage distribution of the cell programmed to the second highest state "01" increases slightly. However, a threshold voltage at the second highest state "01" is changed due to floating gate coupling caused by the change of a voltage (i.e., charge injection), which corresponds to a difference (i.e., a least change) between the "11" state of the erased cell and the third highest state "10", and therefore, that change may be accepted as a trade-off for a reduction of the total number of programming operations.

Figure 6:
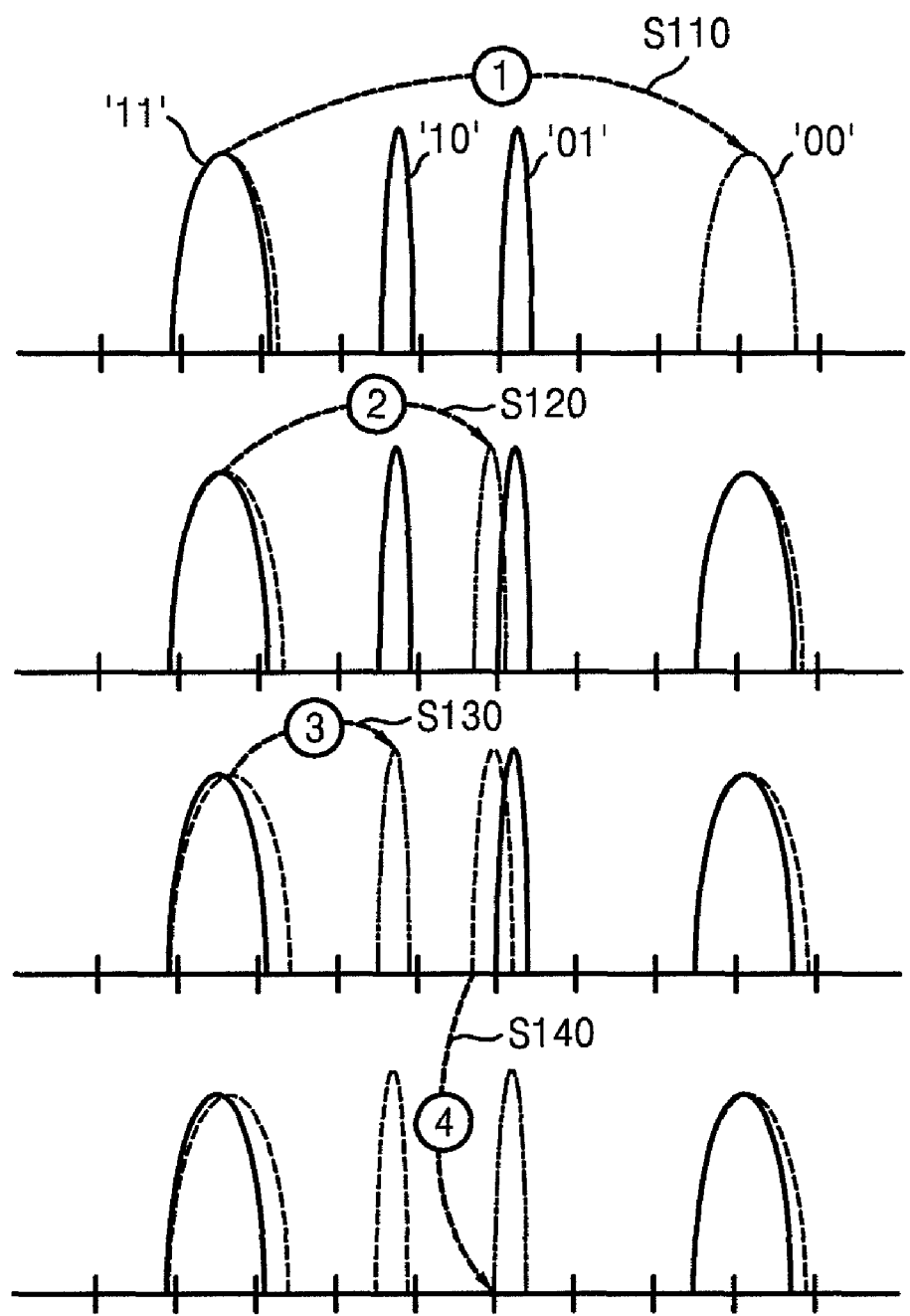
FIG. 6 illustrates threshold voltage distributions to explain a second exemplary programming method of a nonvolatile semiconductor memory device, according to another embodiment of the present invention.

FIG. 6 illustrates threshold voltage distributions to explain a second exemplary programming method of the nonvolatile semiconductor memory device 100 of FIG. 4, according to another embodiment of the present invention. Referring to FIGS. 4 and 6, the controller 10 may control the write driver 30 to program a cell to be programmed to the first data state (e.g., the highest state "00") in step S110, program a cell to be programmed to a second data state (e.g., the second highest state "01") to a voltage distribution a predetermined level lower than a threshold voltage distribution corresponding to the second data state in step S120, program a cell to be programmed to a third data state (e.g., the third highest state "10") to a threshold voltage distribution corresponding to the third data state in step S130, and program the cell, which has been programmed to the voltage distribution the predetermined level lower than the threshold voltage distribution corresponding to the second data state in step S120, to the threshold voltage distribution corresponding to the second data state in step S140.

In other words, the programming method illustrated in FIG. 6 is similar to that illustrated in FIG. 5, but in the programming method illustrated in FIG. 6 the nonvolatile semiconductor memory device 100 does not directly program the cell to be programmed to the second data state (i.e. the "01" state) to the threshold voltage distribution (hereinafter, referred to as a second target threshold voltage distribution) corresponding to the second data state but programs that cell to the voltage distribution the predetermined level lower than the second target threshold voltage distribution in step S120 and then programs the cell again to the second target threshold voltage distribution in step S140. It is apparent that the predetermined level may have various values according to embodiments of the present invention.

Accordingly, the influence of floating gate coupling exerted on the cell in the third data state (i.e., the "10" state) corresponds to the predetermined level and is thus very weak. The influence of floating gate coupling exerted on the cell in the first data state (i.e., the "00" state) and the cell in the erased state (i.e. the "11" state) is similar to that described with reference to FIG. 5. Thus, a detailed description thereof will be omitted.

Meanwhile, in order to program the cell to be programmed to the second data state to the voltage distribution the predetermined level lower than the second target threshold voltage distribution, the nonvolatile semiconductor memory device 100 may program the cell such that the threshold voltage of the cell is increased by a predetermined value, then verifies whether the increased threshold voltage meets the voltage distribution the predetermined level lower than the second target threshold voltage distribution, and, if it is verified that the increased threshold voltage does not meet the voltage distribution the predetermined level lower than the second target threshold voltage distribution, then program the cell to increase the threshold voltage of the cell by the predetermined value again. This programming operation is repeated until the cell reaches the voltage distribution the predetermined level lower than the second target threshold voltage distribution.

In other words, the nonvolatile semiconductor memory device 100 may program a cell such that a threshold voltage distribution of the cell is increased by a predetermined value and then program the cell again if it is verified that the increased threshold voltage distribution does not reach a target threshold voltage distribution. The programming operation and the verification may be repeated until the cell is programmed to the target threshold voltage distribution. In order to repeat the verification and the programming operation, the nonvolatile semiconductor memory device 100 may use a predetermined set function, e.g., a verify-read function.

Alternatively the nonvolatile semiconductor memory device 100 may perform a programming operation, in which the threshold voltage distribution of a cell to be programmed to the second data state is increased by a predetermined value a predetermined number of times until the cell is programmed to the voltage distribution the predetermined level lower than the second target threshold voltage distribution. At this time, the cell is programmed to a desired voltage distribution by repeating the programming operation the predetermined number of times, which is determined through experiments, calibration, or the like, without performing the verification.

Alternatively, the nonvolatile semiconductor memory device 100 may perform a programming operation, in which the threshold voltage distribution of a cell is increased by a predetermined value a predetermined number of times until the cell is programmed to the voltage distribution a predetermined level lower than a third target threshold voltage distribution. The predetermined number of times that the programming operation is repeated may vary with a target voltage distribution, e.g., the voltage distribution the predetermined level lower than the second target threshold voltage distribution or the voltage distribution the predetermined level lower than the third target threshold voltage distribution.

Figure 7:
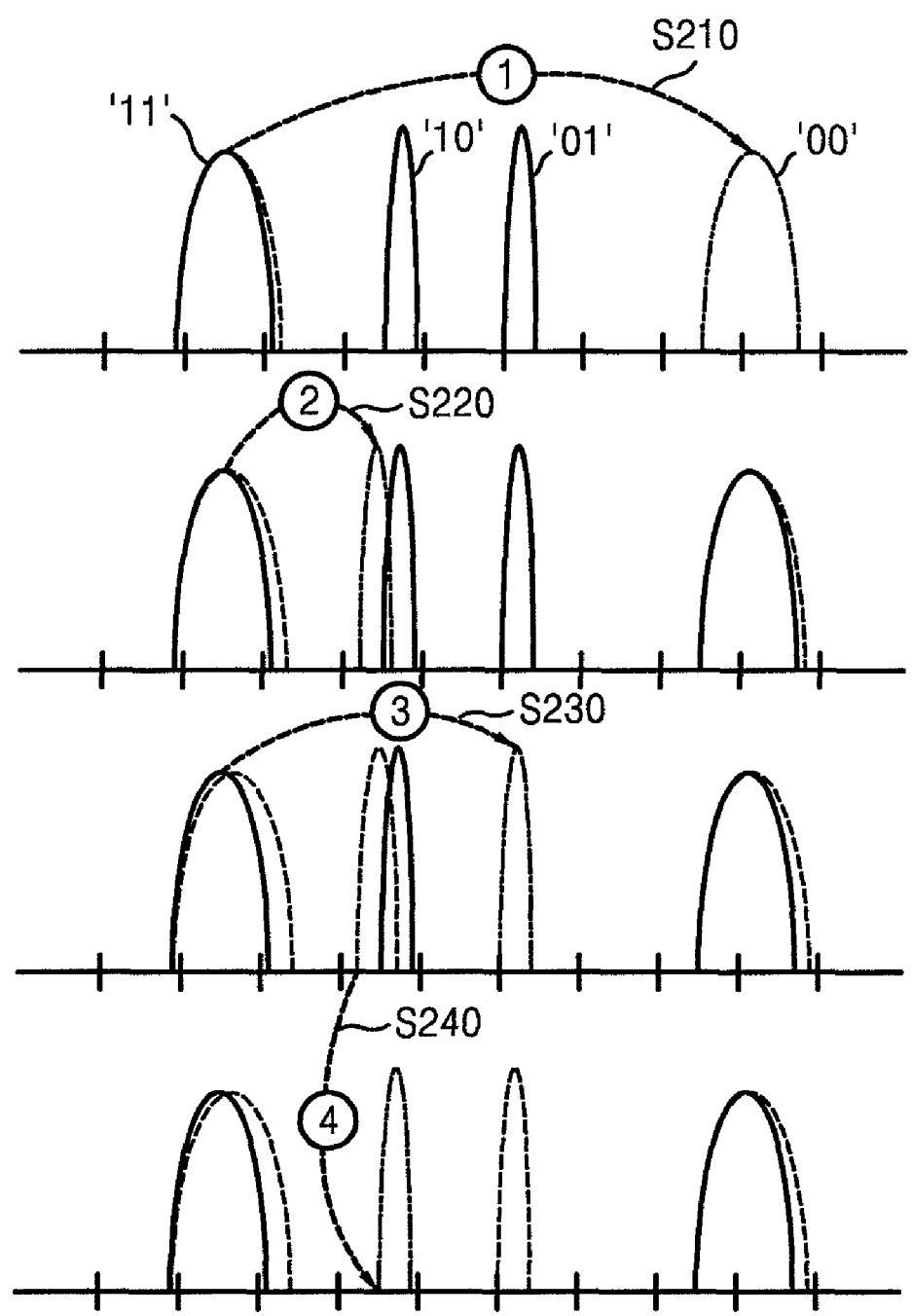
FIG. 7 illustrates threshold voltage distributions to explain a third exemplary programming method of a nonvolatile semiconductor memory device, according to a further embodiment of the present invention.

FIG. 7 illustrates threshold voltage distributions to explain a programming method of the nonvolatile semiconductor memory device 100 of FIG. 4, according to another exemplary embodiment of the present invention. Referring to FIGS. 4 and 7, the controller 10 may control the write driver 30 to program a cell to be programmed to the first data state (e.g., the highest state "00") in step S210, program a cell to be programmed to a second data state (e.g., the third highest state "10") to a voltage distribution a predetermined level lower than a threshold voltage distribution corresponding to the second data state in step S220, program a cell to be programmed to a third data state (e.g., the second highest state "01") to a threshold voltage distribution corresponding to the third data state in step S230, and program the cell, which has been programmed to the voltage distribution the predetermined level lower than the threshold voltage distribution corresponding to the second data state in step S220, to the threshold voltage distribution corresponding to the second data state in step S240.

The programming method illustrated in FIG. 7 is similar to that illustrated in FIG. 6, but the second data state and the third data state respectively correspond to the "01" state and the "10" state in the programming method illustrated in FIG. 6 while the second data state and the third data state respectively correspond to the "10" state and the "01" state in the programming method illustrated in FIG. 7. Accordingly, the influence of floating gate coupling with respect to each state illustrated in FIG. 7 is similar to that illustrated in FIG. 6. Thus, a detailed description thereof will be omitted.

Figure 8:
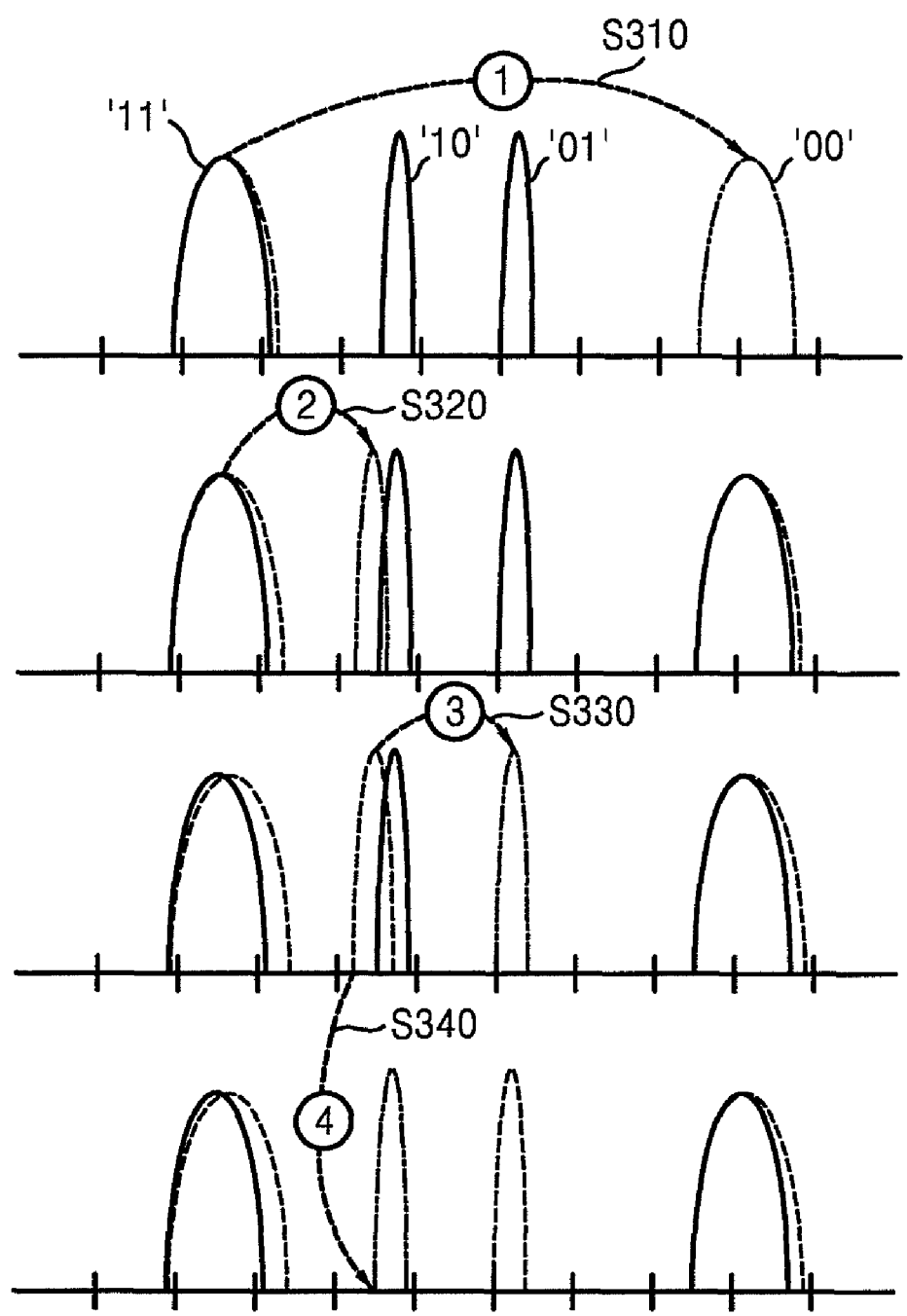
FIG. 8 illustrates threshold voltage distributions to explain a fourth exemplary programming method of a nonvolatile semiconductor memory device, according to another embodiment of the present invention.

FIG. 8 illustrates threshold voltage distributions to explain a programming method of the nonvolatile semiconductor memory device 100, according to another exemplary embodiment of the present invention. Referring to FIGS. 4 and 8, the controller 10 may control the write driver 30 to program a cell to be programmed to the first data state (e.g., the "00" state) in step S310, program a cell to be programmed to a second data state (e.g., the "01" state) and a cell to be programmed to a third data state (e.g., the "10" state) to a voltage distribution a predetermined level lower than a threshold voltage distribution corresponding to the third data state (hereinafter, referred to as a third target threshold voltage distribution) in step S320, program the cell to be programmed to the second data state to a threshold voltage distribution corresponding to the second data state (hereinafter, referred to as a second target threshold voltage distribution) in step S330, and program the cell to be programmed to the third data state (i.e., the cell to be programmed to the third data state among the cells programmed in step S320) to the third target threshold voltage distribution in step S340.

In other words, the nonvolatile semiconductor memory device 100 programs cells to be programmed to a highest state (e.g. the "00" state) to the threshold voltage distribution (hereinafter, referred to as a first target threshold voltage distribution) corresponding to the first data state in step 310. Next, the nonvolatile semiconductor memory device 100 programs cells programmed to a second highest state (e.g., the "01" state) and cells to be programmed to a third highest state (e.g., the "10" state) to a voltage distribution the predetermined level lower than the third target threshold voltage distribution in step S320. Next, the nonvolatile semiconductor memory device 100 programs the cells, which have been programmed to the voltage distribution the predetermined level lower than the third target threshold voltage distribution and are to be programmed to the second highest state, to the second target threshold voltage distribution in step S330. Next, the nonvolatile semiconductor memory device 100 programs the cells, which have been programmed to the voltage distribution the predetermined level lower than the third target threshold voltage distribution and are to be programmed to the third highest state, to the third target threshold voltage distribution in step S340.

As described above, according to various embodiments of the present invention, the number of programming operations (steps)_and the influence of floating gate coupling can be reduced.

While the present invention has been shown and described with reference to exemplary embodiments thereof it will be understood by those of ordinary skill in the art that various changes in form and detail may be made herein without departing from the spirit and scope of the present invention, as defined by the following claims.

What is claimed is:

1. A programming method of a nonvolatile semiconductor memory device which includes a plurality of adjacent memory cells each cell having threshold voltage distributions corresponding respectively to first second, third and fourth data states, the programming method comprising:
   programming a cell to be programmed to the first data state among the plurality of adjacent memory cells to a threshold voltage distribution corresponding to the first data state; and
   programming a cell to be programmed to the second data state and a cell to be programmed to the third data state among the plurality of adjacent memory cells,
   wherein the first data state has the highest threshold voltage distribution among multiple data states,
   wherein the programming the cell to be programmed to the second data state and the cell to be programmed to the third data state comprises:
   programming the cell to be programmed to the second data state to a voltage distribution a predetermined level lower than the threshold voltage distribution corresponding to the second data state;
   programming the cell to be programmed to the third data state to the threshold voltage distribution corresponding to the third data state; and
   programming the cell, which has been programmed to the voltage distribution the predetermined level lower than the threshold voltage distribution corresponding to the second data state, to the threshold voltage distribution corresponding to the second data state.

2. The programming method of claim 1, wherein the second data state and the third data state have the second highest threshold voltage distribution and the third highest threshold voltage distribution, respectively, among the multiple data states.

3. The memory device comprising of claim 2, wherein the voltage distribution a predetermined level lower than the threshold voltage distribution corresponding to the second data state is greater than the threshold voltage distribution corresponding to the third data state.

4. The programming method of claim 1, wherein the programming the cell to be programmed to the second data state to the voltage distribution the predetermined level lower than the threshold voltage distribution corresponding to the second data state comprises:
   programming the cell such that the threshold voltage of the cell is increased by a predetermined value until the threshold voltage of the cell reaches the voltage distribution the predetermined level lower than the threshold voltage distribution corresponding to the second data state;
   determining whether the increased threshold voltage meets the voltage distribution the predetermined level lower than the threshold voltage distribution corresponding to the second data state; and
   if it is determined that the increased threshold voltage does not meet the voltage distribution the predetermined level lower than the threshold voltage distribution corresponding to the second data state, then programming the cell to increase the threshold voltage of the cell by the predetermined value again.

5. The programming method of claim 1, wherein the programming the cell to be programmed to the second data state to the voltage distribution the predetermined level lower than the threshold voltage distribution corresponding to the second data state comprises performing a programming operation, in which a threshold voltage of the cell is increased by a predetermined value a predetermined number of times until the cell is programmed to the voltage distribution the predetermined level lower than the threshold voltage distribution corresponding to the second data state.

6. The memory device comprising of claim 1, wherein the threshold voltage distribution corresponding to the second data state is higher than the threshold voltage distribution corresponding to the third data state, and wherein the voltage distribution a predetermined level lower than the threshold voltage distribution corresponding to the second data state is greater than the threshold voltage distribution corresponding to the third data state.

7. A nonvolatile semiconductor memory device comprising:
   a memory cell array comprising a plurality of adjacent memory cells, each cell having threshold voltage distributions respectively corresponding to first, second, third, and fourth data states;
   a write driver configured to program data stored in a input/output buffer into each of the memory cells in the memory cell array; and
   a controller configured to control the write driver to program a cell to be programmed to the first data state to the threshold voltage distribution corresponding to the first data state based on the data stored in the input/output buffer before controlling the write driver to program any cells to be programmed to the second, third or fourth data states based on the data stored in the input/output buffer,
   wherein after the cell to be programmed to the first data state is programmed:

the controller controls the write driver to program a cell to be programmed to a second data state to a voltage distribution a predetermined level lower than the threshold voltage distribution corresponding to the second data state; and the controller controls the write driver to program a cell to be programmed to a third data state to the threshold voltage distribution corresponding to the third data state; and then the controller controls the write driver to program the cell, that has been programmed to the voltage distribution the predetermined level lower than the threshold voltage distribution corresponding to the second data state, to the threshold voltage distribution corresponding to the second data state.

8. The nonvolatile semiconductor memory device of claim 7, wherein in order to program the cell to be programmed to the second data state to the voltage distribution the predetermined level lower than the threshold voltage distribution corresponding to the second data state, the controller controls the write driver to program the cell such that a threshold voltage of the cell is increased by a predetermined value until the threshold voltage of the cell reaches the voltage distribution the predetermined level lower than the threshold voltage distribution corresponding to the second data state; to determine whether the increased threshold voltage meets the voltage distribution the predetermined level lower than the threshold voltage distribution corresponding to the second data state; and if it is determined that the increased threshold voltage does not meet the voltage distribution the predetermined level lower than the threshold voltage distribution corresponding to the second data state, to program the cell so as to increase the threshold voltage of the cell by the predetermined value again.

9. The nonvolatile semiconductor memory device of claim 7, wherein the controller controls the write driver to perform a programming operation in which a threshold voltage of the cell is increased by a predetermined value a predetermined number of times until the cell is programmed to the voltage distribution the predetermined level lower than the threshold voltage distribution corresponding to the second data state.

10. The memory device comprising of claim 7, further comprising:
a column selector configured to select a bit line included in the memory cell array;
the input/output buffer configured to temporarily store data to be programmed into the memory cell array or data output from the memory cell array.

11. The memory device comprising of claim 7, wherein the threshold voltage distribution corresponding to the second data state is higher than the threshold voltage distribution corresponding to the third data state, and wherein the voltage distribution a predetermined level lower than the threshold voltage distribution corresponding to the second data state is greater than the threshold voltage distribution corresponding to the third data state.

12. A nonvolatile semiconductor memory device comprising:
a memory cell array comprising a plurality of adjacent memory cells, each cell having threshold voltage distributions respectively corresponding to first, second, third, and fourth data states, wherein the highest threshold voltage distribution corresponds to the first data state;
a write driver configured to program data into each of the memory cells in the memory cell array; and
a controller configured to control the write driver to first program any cells to be programmed to the first data state, based on the data, to the threshold voltage distribution corresponding to the first data state prior to controlling the write driver to program any cells to be programmed to the second, third or fourth data states,
wherein after the cell to be programmed to the first data state is programmed:
the controller controls the write driver to program a cell to be programmed to a second data state to a voltage distribution a predetermined level lower than the threshold voltage distribution corresponding to the second data state; and
the controller controls the write driver to program a cell to be programmed to a third data state to the threshold voltage distribution corresponding to the third data state; and then
the controller controls the write driver to program the cell, that has been programmed to the voltage distribution the predetermined level lower than the threshold voltage distribution corresponding to the second data state, to the threshold voltage distribution corresponding to the second data state.

13. The memory device comprising of claim 12, further comprising:
a column selector configured to select a bit line included in the memory cell array; and
an input/output buffer configured to temporarily store the data to be programmed into the memory cell array.

14. The memory device comprising of claim 12, wherein the threshold voltage distribution corresponding to the second data state is higher than the threshold voltage distribution corresponding to the third data state, and wherein the voltage distribution a predetermined level lower than the threshold voltage distribution corresponding to the second data state is greater than the threshold voltage distribution corresponding to the third data state.

* * * * *